US012656380B2

(12) United States Patent
Bernacchia

(10) Patent No.: US 12,656,380 B2
(45) Date of Patent: Jun. 16, 2026

(54) CURRENT SENSING INTEGRATED CIRCUIT AND CORRESPONDING METHOD

(71) Applicant: Infineon Technologies Austria AG, Villach (AT)

(72) Inventor: Giuseppe Bernacchia, Villach (AT)

(73) Assignee: Infineon Technologies Austria AG, Villach (AT)

( * ) Notice: Subject to any disclaimer, the term of this patent is extended or adjusted under 35 U.S.C. 154(b) by 140 days.

(21) Appl. No.: 18/443,446

(22) Filed: Feb. 16, 2024

(65) Prior Publication Data

US 2024/0280614 A1 Aug. 22, 2024

(30) Foreign Application Priority Data

Feb. 17, 2023 (EP) ..................................... 23157175

(51) Int. Cl.
*G01R 19/32* (2006.01)
*G01R 19/00* (2006.01)

(52) U.S. Cl.
CPC ......... *G01R 19/32* (2013.01); *G01R 19/0046* (2013.01)

(58) Field of Classification Search
None
See application file for complete search history.

(56) References Cited

U.S. PATENT DOCUMENTS

| | | | |
|---|---|---|---|
| 5,272,392 A | 12/1993 | Wong et al. | |
| 5,973,551 A | 10/1999 | Mitsuda | |
| 7,336,085 B2 | 2/2008 | Fabbro et al. | |
| 2002/0024376 A1* | 2/2002 | Sander | H03K 17/0822 |
| | | | 327/407 |
| 2006/0250153 A1* | 11/2006 | Colbeck | G01R 19/0092 |
| | | | 324/762.09 |
| 2010/0244947 A1* | 9/2010 | Massie | G01R 19/0092 |
| | | | 29/25.01 |
| 2017/0060152 A1 | 3/2017 | Martini | |
| 2018/0269677 A1* | 9/2018 | Yamamura | H03K 17/08128 |
| 2022/0065901 A1 | 3/2022 | Desai et al. | |
| 2023/0060086 A1* | 2/2023 | Yano | G01R 19/32 |

FOREIGN PATENT DOCUMENTS

CN 110275051 A 9/2019

* cited by examiner

*Primary Examiner* — Jas A Sanghera
(74) *Attorney, Agent, or Firm* — Murphy, Bilak & Homiller, PLLC

(57) ABSTRACT

An integrated circuit is presented. The integrated circuit includes a first terminal, a second terminal, a control terminal, a current monitor terminal, a power transistor coupled between the first terminal and the second terminal, and a replica transistor coupled between the first terminal and the current monitor terminal. The integrated circuit is configured to control a current between the first terminal and the second terminal based on a control signal applied to the control terminal. The integrated circuit is further configured to provide, at the current monitor terminal, a current monitor signal indicative of a value of the current.

15 Claims, 6 Drawing Sheets

FIG 3

CURRENT SENSING INTEGRATED CIRCUIT AND CORRESPONDING METHOD

TECHNICAL FIELD

The present document relates to integrated circuits with current sensing capabilities. In particular, the present document relates to an integrated circuit comprising a power transistor and current sensing means for sensing a current through this power transistor.

BACKGROUND

Current sensing is a key feature required in all power systems either for the control loop or for telemetry reporting. As of today, several solutions are available in the market.

A first solution is based on shunt resistors. This is one the of most common solutions, thanks to its accuracy. The main drawback is that the shunt resistor size is increasing with the power capability. Also, there is a trade-off between the available signal versus power dissipated: the smaller the resistor, the less the power, but the less accurate the system and the higher the sensitivity to noise. Shunt resistors are normally placed in series with the power transistor. When current flows through the power device, large ringing and over-shoot is present at the common node between the resistor and the power transistor due to parasitic inductances and capacitances. This can negatively affect the performances of the driving stage.

A second solution is based on hall sensors. This solution is also very common, especially in battery powered applications. The advantage is the intrinsic isolation provided by the sensor. The main drawback is the reduced bandwidth and the relatively high cost of the sensors.

A third solution is based on inductive sensors (such as e.g. Rogowski coils or inductive coupling). However, these solutions are not really suitable for DC current sensing and the sensors are typically bulky.

A fourth solution is based on inductor current sensing: For instance, this solution is used in non-isolated dc-dc converters. It uses a matched network in parallel to the main inductor to reconstruct the current waveform. It is intrinsically a lossless solution. The main drawbacks are: dependency on the absolute tolerance of the inductor and its DCR. It needs an external amplifier or an integrated high-voltage solution for proper operation.

In view of the forgoing discussion, it is an object of this invention to provide a novel power device with improved current sensing capabilities.

SUMMARY

According to an aspect, an integrated circuit is presented. The integrated circuit may comprise a first terminal, a second terminal, a control terminal, a current monitor terminal, a power transistor coupled between the first terminal and the second terminal, and a replica transistor coupled between the first terminal and the current monitor terminal. The integrated circuit may be configured to control a current between the first terminal and the second terminal based on a control signal applied to the control terminal. The integrated circuit may be configured to provide, at the current monitor terminal, a current monitor signal indicative of a value of said current.

The integrated circuit may comprise various circuit elements such as e.g. the power transistor and the replica transistor, and all circuit elements may be integrated on a single piece of semiconductor material. The semiconductor material may comprise e.g. silicon. Alternatively, the semiconductor material may comprise a compound semiconductor material such as gallium nitride (GaN) or silicon carbide (SiC). The integrated circuit may also be denoted as monolithic integrated circuit, chip, or microchip.

The current may flow in both directions, i.e. the current may flow from the first terminal to the second terminal or from the second terminal to the first terminal.

In general, the integrated circuit may be regarded as a switching element configured to control the current between the first terminal and the second terminal by switching between an on-state and an off-state: In the on-state, a low-ohmic electrical connection may be established by the power transistor between the first terminal and the second terminal and, at the same time, the current between the first terminal and the second terminal may be sensed/monitored with the help of the replica transistor and the current monitor signal may be generated at the current monitor terminal to indicate the value of said current. In the off-state, a high-ohmic electrical connection may be established by the power transistor between the first terminal and the second terminal. In other words, the integrated circuit may be regarded as a switching element (such as e.g. a FET transistor) with current sensing capabilities during the on-state of this switching element.

On the one hand, within this document, a "terminal" is referred to as an electrical contact which is accessible from the outside of the integrated circuit. For example, a terminal may be a single electrical contact at the surface of the integrated circuit such as e.g. a metal pad, a metal pin, a metal ball, a metal wire, or a metal lead. The skilled person will readily understand that, in practical implementations, more than one electrical contact may be used to implement the respective terminal of the integrated circuit. The term "node", on the other hand, is used to denote an electrical contact which is located within the integrated circuit, and which may not be accessible from the outside of the integrated circuit.

The power transistor may be implemented with any suitable device, such as, for example, a metal-oxide-semiconductor field effect transistor MOSFET, an insulated-gate bipolar transistors IGBT, a MOS-gated thyristor, or any other suitable power device. For instance, the power transistor may be implemented using a III-V compound semiconductor material such as e.g. a GaN-high-electron-mobility transistor HEMT. If the power transistor is implemented using GaN compound semiconductor material, also the other components of the integrated circuit (and in particular the replica transistor) may be implemented using GaN compound semiconductor material. Likewise, if the power transistor is implemented using SiC compound semiconductor material, also the other components of the integrated circuit (and in particular the replica transistor) may be implemented using SiC compound semiconductor material.

The power transistor may be operated as a switch. For this purpose, a suitable control signal or driving voltage may be applied to the control node of the power transistor to turn the power transistor on (i.e. to close the switch) or to turn the power transistor off (i.e. to open the switch).

The replica transistor may be implemented similarly as the power transistor using the same technology but a different dimensioning. The replica transistor may be implemented in close vicinity to the power transistor on the integrated circuit in order to guarantee a stable scaling ratio between both transistors.

The control terminal may be coupled to a control node of the power transistor, and the control terminal may be coupled to a control node of the replica transistor. For example, the control node of the power transistor may be the gate of the power transistor and the control node of the replica transistor may be the gate of the replica transistor.

A controlled section of the power transistor may be coupled between the first terminal and the second terminal, and a controlled section of the replica transistor may be coupled between the first terminal and the second terminal. For example, the controlled section of the power transistor may be the drain-source-channel of the power transistor, and the controlled section of the replica transistor may be the drain-source channel of the replica transistor.

An on-resistance of the replica transistor may be K-times larger than an on-resistance of the power transistor. The factor K may be an integer. For instance, the factor K may be an integer between 1000 and 50000. At this, the on-resistance of the replica transistor is denoted as the resistance of the controlled section of the replica transistor when the replica transistor is turned on. Analogously, the on-resistance of the power transistor is denoted as the resistance of the controlled section of the power transistor when the power transistor is turned on. Because of the different on-resistances, a replica current flowing through the replica transistor may be substantially smaller than the current flowing through the power transistor.

The integrated circuit may comprise a first resistive element coupled in series with the replica transistor between the first terminal and the second terminal. A node connecting the first resistive element with the replica transistor may be coupled to the current monitor terminal.

A drain of the power transistor may be connected to the first terminal, a drain of the replica transistor may be connected to the first terminal, a source of the power transistor may be connected to the second terminal, a source of the replica transistor may be connected to the current monitor terminal, and the first resistive element may be connected between the current monitor terminal and the second terminal.

The first resistive element may be embedded in the same MOSFET die as the power transistor and the replica transistor. The first resistive element may be implemented using one of the available layers such as e.g. the metal layer used for the gate of the power transistor. In general, the first resistive element may be implemented on any of the resistive layers used for building the power transistor. For example, the first resistive element may have the shape of a meander and may be arranged on an outer surface of the power transistor die. Alternatively, the first resistive element may be implemented using the drain-source channel of another (FET-) transistor. The first resistive element may have a resistance value in the range of 10 to 100 Ohm.

Thus, with the help of the first resistive element, it becomes possible to provide, at the current monitor terminal, the current monitor signal indicative of the value of the current through the power transistor. More specifically, the on-resistance of the controlled section of the replica transistor and the first resistive element may form a voltage divider for dividing the voltage across the power transistor, wherein the latter voltage may be determined by multiplying the value of the current with the on-resistance of the power transistor. Thus, the value of the current through the power transistor may be determined/estimated based on the voltage (representing the current monitor signal) at the current monitor terminal.

The integrated circuit may comprise a temperature monitor terminal, and the integrated circuit may be configured to provide, at the temperature monitor terminal, a temperature monitor signal indicative of a temperature of the first resistive element. In particular, the integrated circuit may comprise a second resistive element coupled between the temperature monitor terminal and are reference potential. The reference potential may be e.g. the second terminal of the integrated circuit. In general, within this document, the term "reference potential" is meant in its broadest possible sense. In particular, the reference potential is not limited to ground i.e. a reference potential with a direct physical connection to earth or a voltage of 0V. Rather, the term "reference potential" may refer to any reference point within the integrated circuit to which and from which electrical currents may flow or from which voltages may be measured.

The second resistive element may be integrated/embedded in the integrated circuit in the same or a similar manner as described for the first resistive element in the foregoing description.

The second resistive element may be regarded as a temperature sensor for sensing a temperature of the power transistor and/or the second resistive element. Thus, the second resistive element may make it possible to obtain an estimate for said temperature and to use this estimation for compensating the temperature behavior of the first resistive element. Thus, with the help of the second resistive element, a more accurate value of the current through the power transistor may be provided at the current monitor terminal.

Alternatively or additionally, the integrated circuit may comprise an amplifier circuit. A first input of the amplifier circuit may be coupled to the power transistor. A second input of the amplifier circuit may be coupled to the replica transistor. A first output of the amplifier circuit may be coupled to the current monitor terminal. More specifically, the first input of the amplifier circuit may be coupled to the source of the power transistor, the second input of the amplifier circuit may be coupled to the source of the replica transistor, and a second output of the amplifier circuit may be coupled to the source of the replica transistor. At this, the amplifier circuit may be configured to regulate a voltage at the source of the replica transistor such that the voltage at the source of the replica transistor approaches a voltage at the source of the power transistor. As a result, the power transistor and the replica transistor may form some sort of current mirror as their gates may be connected together, their drains may be connected together, and their sources may be regulated by the amplifier circuit to be at the same voltage or at least at very similar voltages.

The source of the replica transistor may be connected to an inverting input of the amplifier circuit, and the source of the power transistor may be connected to a non-inverting input of the amplifier circuit. A drain of the power transistor may be connected to the first terminal, a drain of the replica transistor may be connected to the first terminal, and the source of power transistor may be connected to the second terminal.

According to another aspect, a method of operating an integrated circuit is presented. The method may comprise steps corresponding to the functional features of the integrated circuit described throughout this document. The integrated circuit may comprise a first terminal, a second terminal, a control terminal, a current monitor terminal, a power transistor coupled between the first terminal and the second terminal, and a replica transistor coupled between the first terminal and the current monitor terminal. The method may comprise controlling a current between the first terminal and the second terminal based on a control signal applied to the control terminal. The method may comprise providing, at the current monitor terminal, a current monitor signal indicative of a value of said current.

The method may comprise arranging a first resistive element in series with the replica transistor between the first terminal and the second terminal. The method may comprise coupling a node connecting the first resistive element with the replica transistor to the current monitor terminal. The method may comprise coupling a second resistive element between a temperature monitor terminal and a reference potential. The reference potential may be the second terminal of the integrated circuit.

The method may comprise one or more of the following steps to determine/estimate a temperature of the first resistive element: Firstly, the method may comprise injecting a current into the temperature monitor terminal and, at the same time, measuring a voltage of the temperature monitor terminal. Secondly, the method may comprise connecting an external resistor between the temperature monitor terminal and the control terminal. Thirdly, the method may comprise connecting an external resistor between the temperature monitor terminal and a supply voltage. And fourthly, the method may comprise forcing a voltage on the temperature monitor terminal and, at the same time, monitoring a current at the temperature monitor terminal.

The method may comprise coupling the control terminal to a control node of the power transistor. The method may comprise coupling the control terminal to a control node of the replica transistor. The method may comprise coupling a controlled section of the power transistor between the first terminal and the second terminal. The method may comprise coupling a controlled section of the replica transistor between the first terminal and the second terminal. An on-resistance of the replica transistor may be K-times larger than an on-resistance of the power transistor.

The method may comprise connecting a drain of the power transistor to the first terminal, connecting a drain of the replica transistor to the first terminal, connecting a source of the power transistor to the second terminal, connecting a source of the replica transistor to the current monitor terminal, and connecting the first resistive element between the current monitor terminal and the second terminal.

The integrated circuit may comprise a temperature monitor terminal. The method may comprise providing, at the temperature monitor terminal, a temperature monitor signal indicative of a temperature of the first resistive element.

The method may comprise coupling an amplifier circuit between the replica transistor and the second terminal of the integrated circuit and connecting an output of the amplifier circuit to the current monitor terminal. The method may comprise comparing, by the amplifier circuit, a voltage at a source of the replica transistor with a voltage at a source of the power transistor and generating the current monitor signal based on the result of the comparison. The method may comprise connecting the source of the replica transistor to an inverting input of the amplifier circuit and connecting the source of the power transistor to a non-inverting input of the amplifier circuit. The method may comprise connecting a drain of the power transistor to the first terminal, connecting a drain of the replica transistor to the first terminal, and connecting the source of power transistor to the second terminal.

According to yet another aspect, a control circuit is presented. The control circuit may be configured to control any one of the integrated circuits presented within this document. The control circuit may be configured to generate a control signal for turning on or off a power transistor of the integrated circuit. The control circuit may be configured to read a current monitor signal generated by said integrated circuit, wherein said current monitor signal is indicative of a current flowing through said power transistor.

In general, the control circuit may be implemented in various different application scenarios such as e.g. dc-dc systems. Application scenarios where the presented circuits can be applied are not limited to: telecom (intermediate bus converters, isolated and non-isolated dc-dc converters), motor drives (e.g. for brushless direct current motors), solar optimizers and inverters, protection controllers, servers/datacom converters (digital multiphase, point-of-loads, . . . ). For example, the control circuit may be implemented in a voltage regulator to control a power transistor of the voltage regulator and readout a current value indicative of the current flowing through said power transistor. In this scenario, the integrated circuit described within this document may be used as a switching element of said voltage regulator. Alternatively, the control circuit may be used in a motor control circuit to control and determine the current flowing through a switching element of the motor control circuit. Again, the integrated circuit described within this document may be used as the switching element of the motor control circuit. More specifically, the integrated circuit may be the high side switching element or the low side switching element of a half-bridge, wherein the motor control circuit may comprise three half-bridges in total. For example, the motor control circuit may be configured to control operation of a brushless direct current (BLDC) motor of a power thrill.

In the described application scenarios, the control circuit may be used for the purpose of determining an actual value of the current or for simply determining whether the current exceeds or falls below a given threshold value (i.e. in an overcurrent protection OCP application or an undercurrent protection UCP application).

For example, the control circuit may comprise a driver circuit for generating the gate drive signals for the integrated circuit and a compensation circuit, like e.g. the compensation circuit 30 illustrated in FIG. 3.

The control circuit may be configured to read a temperature monitor signal generated by said integrated circuit, wherein said temperature monitor signal is indicative of a temperature within said integrated circuit. The control circuit may be configured to adjust the read current monitor signal based on the read temperature monitor signal. In particular, the control circuit may be configured to read the temperature monitor signal by injecting a current into the temperature monitor terminal and, at the same time, measuring a voltage of the temperature monitor terminal. The measured voltage may then represent the temperature monitor signal. Or the control circuit may be configured to read the temperature monitor signal by connecting an external resistor between the temperature monitor terminal and the control terminal. Or the control circuit may be configured to read the temperature monitor signal by connecting an external resistor between the temperature monitor terminal and a supply voltage. Or the control circuit may be configured to read the temperature monitor signal by forcing a voltage on the temperature monitor terminal and, at the same time, monitoring a current at the temperature monitor terminal.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE FIGURES

The present invention is illustrated by way of example, and not by way of limitation, in the figures in which like reference numerals refer to similar or identical elements, and in which:

FIG. 3 shows an exemplary compensation circuit for temperature-compensated current sensing using an exemplary integrated circuit with both current and temperature sensing capabilities.

DETAILED DESCRIPTION

Figure 1:
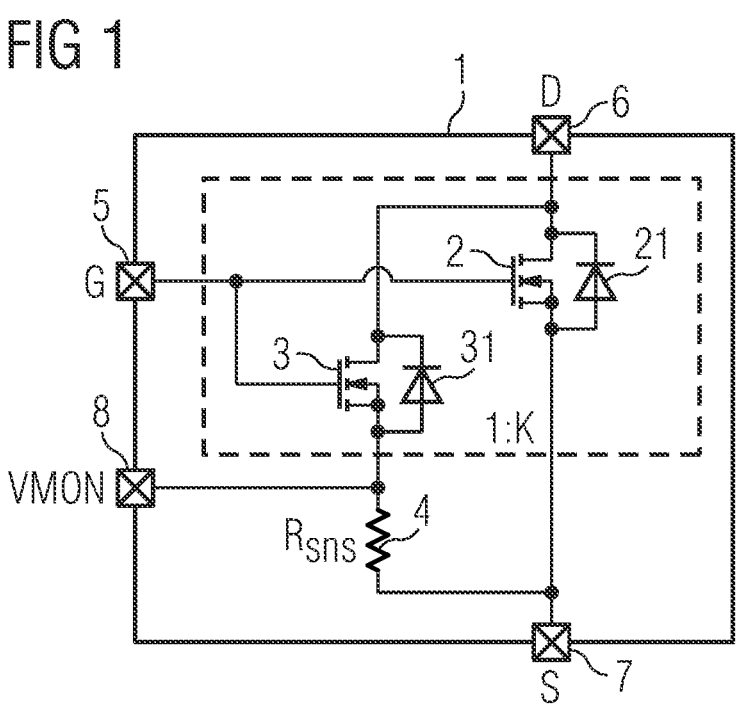
FIG. 1 shows an exemplary circuit diagram of an integrated circuit with current sensing capabilities.

FIG. 1 shows an exemplary circuit diagram of an integrated circuit 1 with current sensing capabilities. The integrated circuit 1 comprises a first terminal 6, a second terminal 7, a control terminal 5, a current monitor terminal 8, a power transistor 2 coupled between the first terminal and the second terminal, and a replica transistor 3 coupled between the first terminal and the current monitor terminal. The integrated circuit 1 controls a current between the first terminal 6 and the second terminal 7 based on a control signal applied to the control terminal 5. Due to the dimensioning of both transistors, said current is mainly flowing through the power transistor 2, and only a small current is flowing through the replica transistor 3. The current is controlled in a sense that both transistors are, depending on the control signal, either turned on or off. In FIG. 1, the body diodes 21 and 31 of both transistors are depicted. The integrated circuit 1 generates, at the current monitor terminal 8, a current monitor signal indicative of a value of said current. The integrated circuit 1 comprises a first resistive element 4 coupled in series with the replica transistor 3 between the first terminal 6 and the second terminal 7. A node connecting the first resistive element 4 with the replica transistor 3 is coupled to the current monitor terminal 8. In other words, the integrated circuit 1 comprises the replica transistor 3 and the resistive element 4 as current sensing means.

The integrated circuit 1 may provide the following advantages: bidirectional sensing without any charge pumps, simpler circuit for external amplifier, bandwidth defined by the replica transistor, limited impact on package and MOS- FET on-resistance RDSon, easy to have second source, and the resistor may be embedded on the MOSFET die.

However, the current monitor signal provided at the current monitor terminal may show a dependency on temperature. By construction, the voltage VMON at the current monitor terminal may be regarded as a partition of the drain-source voltage of the power transistor 2 (Vds=Iload× RDSon) by using the replica transistor's 3 on-resistance RDSon and the resistance of the integrated sense resistor 4. As a result, the current monitor signal VMON is affected by self-heating effects when the current through the power transistor 2 increases.

Figure 2:
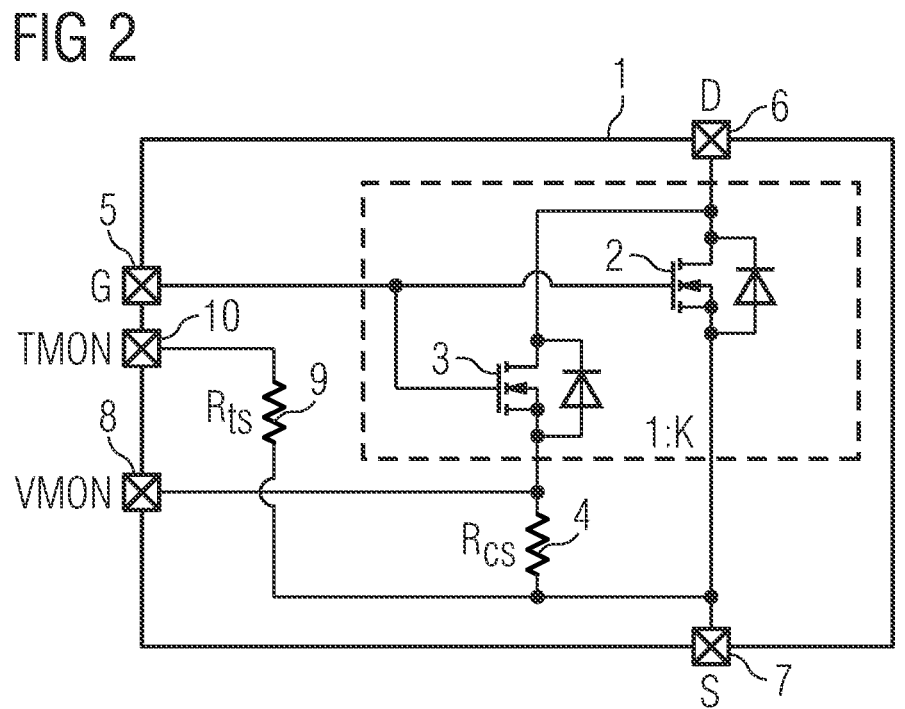
FIG. 2 shows an exemplary circuit diagram of an integrated circuit with current and temperature sensing capabilities.

An example for an improved integrated circuit which addresses this temperature dependency is illustrated in FIG. 2. FIG. 2 shows an exemplary circuit diagram of an integrated circuit 1 with current and temperature sensing capabilities. This integrated circuit 1 comprises, in addition to the elements already described in the context of FIG. 1, a temperature monitor terminal 10 for providing a temperature monitor signal indicative of a temperature of the first resistive element 4 (or in general: a temperature associated with the power transistor 2). The integrated circuit 1 further comprises a second resistive element 9 coupled between the temperature monitor terminal 10 and a reference potential. In the depicted example, the reference potential is chosen to be the source of the power transistor 2.

Figure 3:
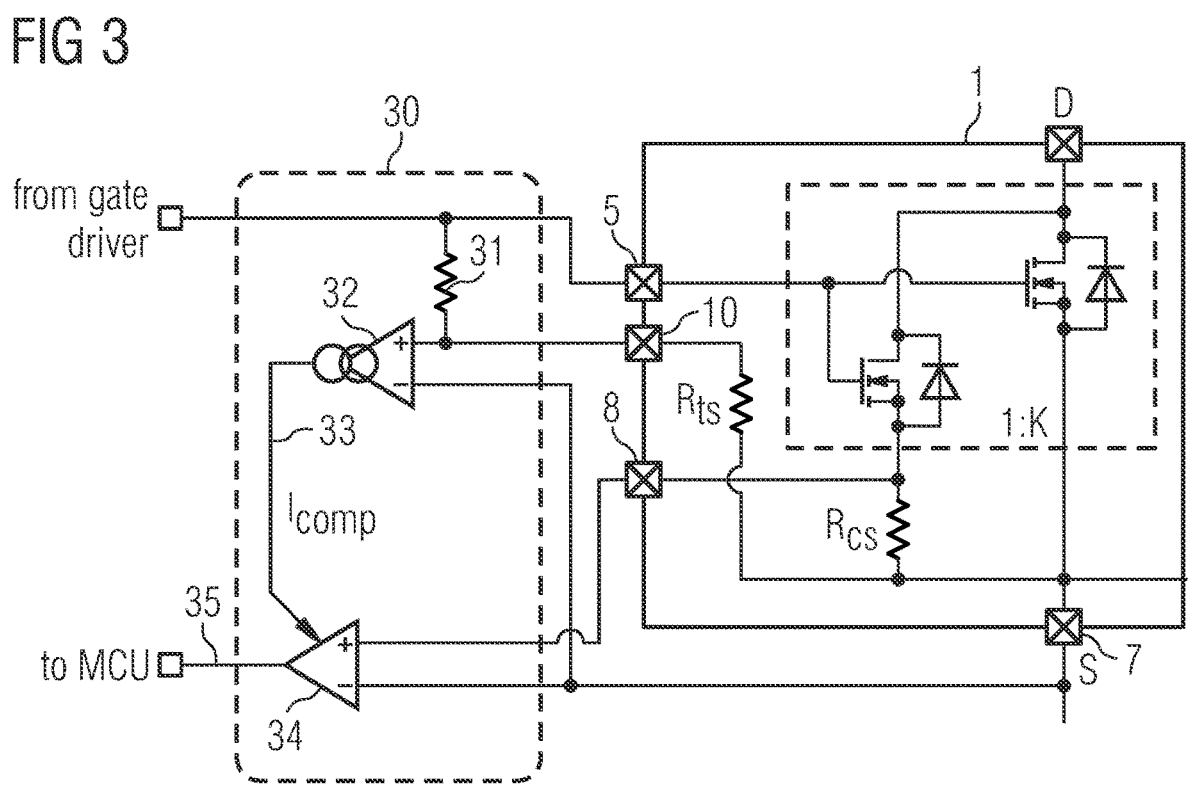

FIG. 3 shows an exemplary compensation circuit 30 for temperature-compensated current sensing using an exemplary integrated circuit 1 with both current and temperature sensing capabilities. Compensation circuit 30 comprises a resistor 31 connected between the gate driver signal generated by the gate driver and the temperature monitor terminal 10 of the integrated circuit 1. The exemplary compensation circuit 30 also comprises a voltage controlled current source (VCCS) 32 (for example an operational transconductance amplifier (OTA) or Gm-stage) for generating a compensation current Icomp 33 based on a voltage difference between the temperature monitor terminal 10 and the second terminal 7 of the integrated circuit 1 (which may be typically connected to a reference potential). The compensation current 33 is then used to compensate the current monitor signal provided at the current monitor terminal 8. In FIG. 3, a compensation amplifier 34 is generating the compensated current monitor signal 35 based on a voltage difference between the current monitor terminal 8 and the second terminal 7 of the integrated circuit 1.

The compensation circuit 30 can be placed in a dedicated IC (e.g. gate driver) or in the controller (e.g. digital controller for the converter or protection controller). Alternatively, an external amplifier can be used. In many applications, there is a microcontroller with accurate an analog-to-digital converter. In this case, the current and temperature sense outputs can be directly digitized by the microcontroller and all processing can be implemented digitally.

Figure 4:
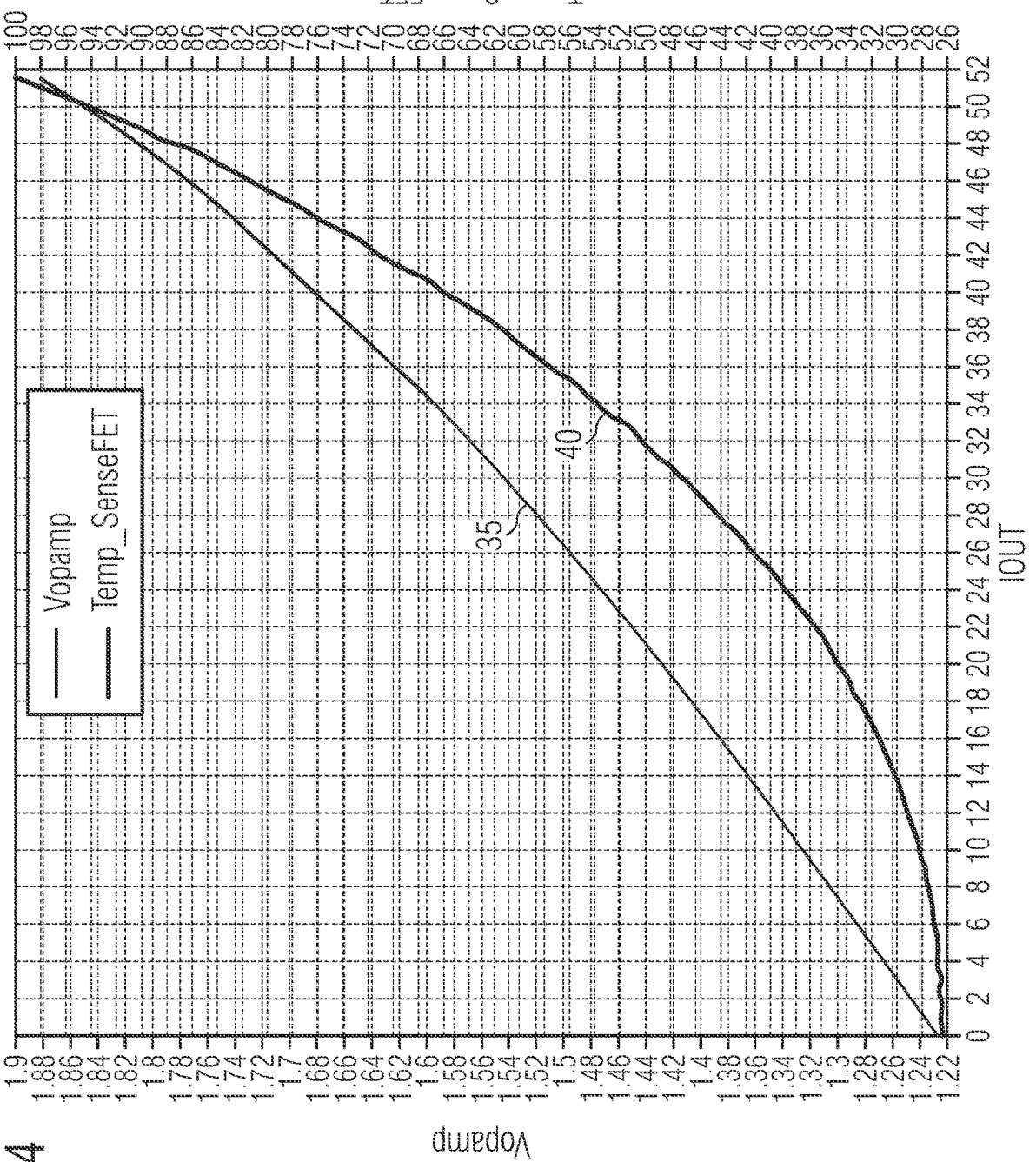
FIG. 4 shows the temperature dependency of the sensed currents.
Figure 5:
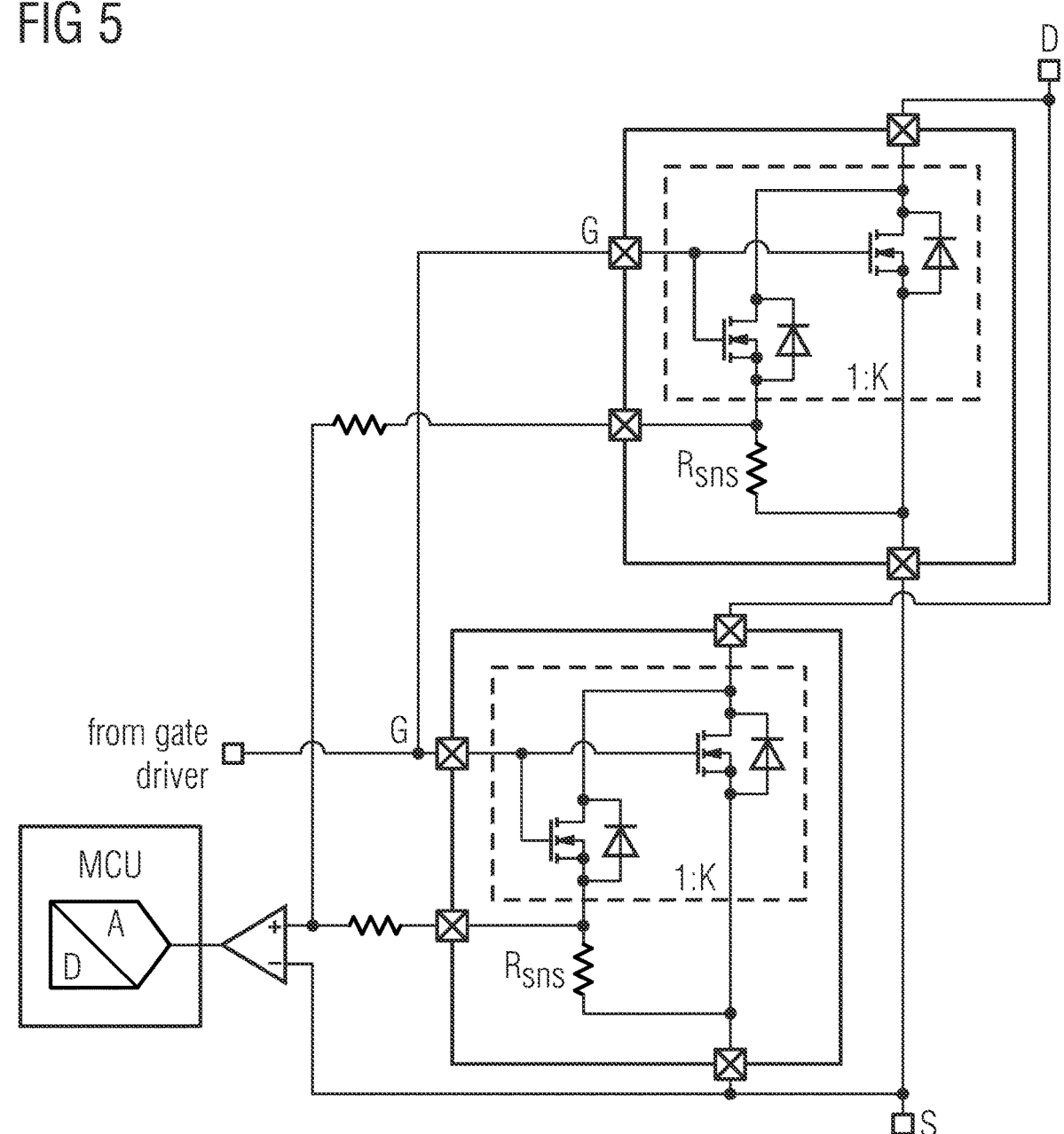
FIG. 5 shows two integrated circuits according to FIG. 1 connected in parallel.

FIG. 4 shows the temperature monitor signal 40 at the temperature monitor terminal 10 for different output currents, and the compensation current monitor signal 35 for different output currents. FIG. 5 shows two integrated circuits according to FIG. 1 connected in parallel.

Figure 6:
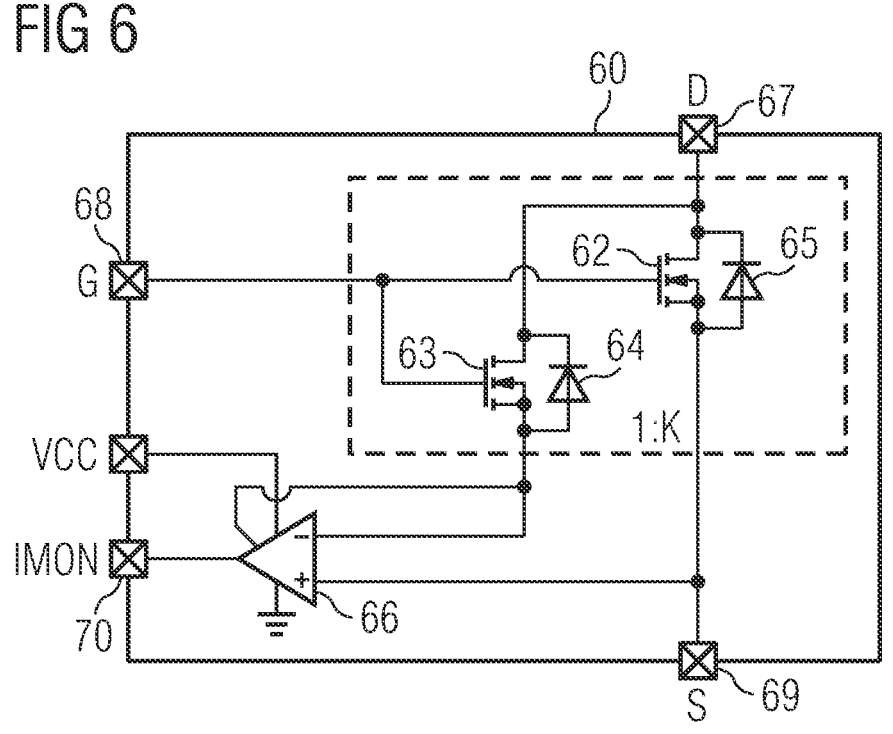
FIG. 6 shows another exemplary circuit diagram of an integrated circuit with current sensing capabilities.

FIG. 6 shows another exemplary circuit diagram of an integrated circuit 60 with current sensing capabilities. The integrated circuit 60 comprises a first terminal 67, a second terminal 69, a control terminal 68, a current monitor terminal 70, a power transistor 62 coupled between the first terminal and the second terminal, and a replica transistor 63 coupled between the first terminal and the current monitor terminal. The integrated circuit 60 controls a current between the first terminal 67 and the second terminal 69 based on a control signal applied to the control terminal 68. Due to the dimensioning of both transistors, said current is mainly flowing through the power transistor 62, and only a small current is flowing through the replica transistor 63. The current is controlled in a sense that both transistors are, depending on the control signal, either turned on or off. In FIG. 6, the body diodes 64 and 65 of both transistors are illustrated. The integrated circuit 60 generates, at the current monitor terminal 70, a current monitor signal indicative of a value of said current. For this purpose, the integrated circuit 70 comprises an amplifier circuit 66, wherein a first input of the amplifier circuit is coupled to the power transistor 62, wherein a second input of the amplifier circuit is coupled to the replica transistor 63, and wherein a first output of the amplifier circuit is coupled to the current monitor terminal 70. The first input of the amplifier circuit 66 is coupled to the source of the power transistor 62, and the second input of the amplifier circuit 66 is coupled to the source of the replica transistor 63, and a second output of the amplifier circuit 66 is coupled to the source of the replica transistor 63 to form a feedback loop. In other words, unlike the integrated circuit 1 in FIG. 1, where the source of the replica transistor is left "floating", the integrated circuit 60 in FIG. 6 comprises a feedback loop to force the voltage at the source of the replica transistor to same (or almost the same) voltage as the voltage at the source of the power transistor. In this way, current sensing with high accuracy may be achieved. Furthermore, the current monitor terminal IMON forms an efficient interface to be coupled with a microcontroller MCU.

Figure 7:
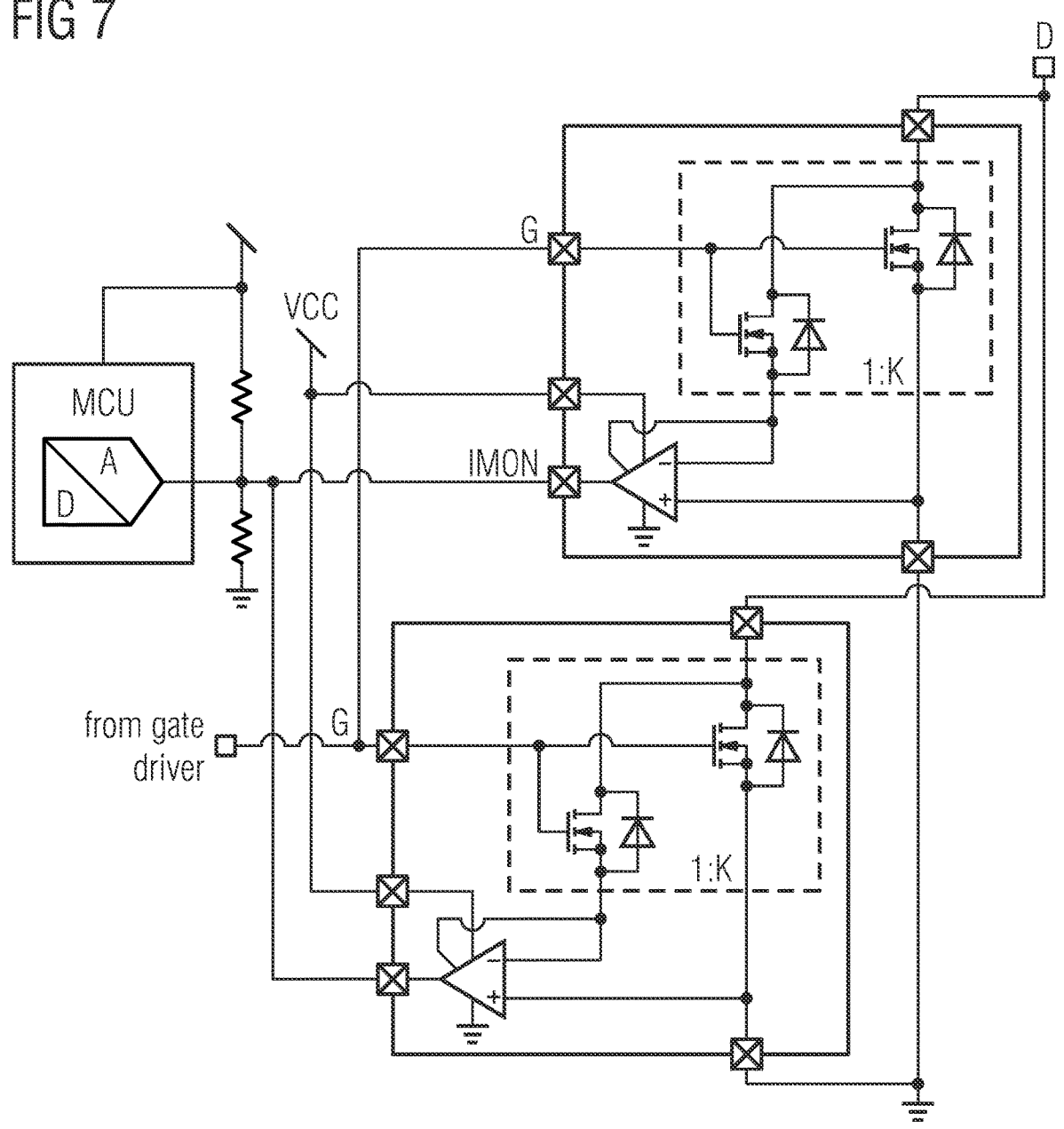
FIG. 7 shows two integrated circuits according to FIG. 6 connected in parallel.

Thus, in summary, the integrated circuit 60 comprises the replica transistor 63 and the amplifier circuit 66 as current sensing means. FIG. 7 shows two integrated circuits according to FIG. 6 connected in parallel.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to cover all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
a first terminal;
a second terminal;
a control terminal;
a current monitor terminal;
a temperature monitor terminal;
a power transistor coupled between the first terminal and the second terminal;
a replica transistor coupled between the first terminal and the current monitor terminal;
a first resistive element in series with the replica transistor between the first terminal and the second terminal, wherein a node connecting the first resistive element with the replica transistor is coupled to the current monitor terminal; and
a second resistive element coupled between the second terminal and the temperature monitor terminal,
wherein the integrated circuit is configured to:
control a current between the first terminal and the second terminal based on a control signal applied to the control terminal;
provide, at the current monitor terminal, a current monitor signal indicative of a value of the current.

2. The integrated circuit of claim 1, wherein the control terminal is coupled to a control node of the power transistor, and wherein the control terminal is coupled to a control node of the replica transistor.

3. The integrated circuit of claim 1, wherein a controlled section of the power transistor is coupled between the first terminal and the second terminal, and wherein a controlled section of the replica transistor is coupled between the first terminal and the second terminal.

4. The integrated circuit of claim 1, wherein an on-resistance of the replica transistor is K-times larger than an on-resistance of the power transistor.

5. The integrated circuit of claim 4, wherein K is an integer between 1000 and 50000.

6. The integrated circuit of claim 1, wherein a drain of the power transistor is connected to the first terminal, wherein a drain of the replica transistor is connected to the first terminal, wherein a source of the power transistor is connected to the second terminal, wherein a source of the replica transistor is connected to the current monitor terminal, and wherein the first resistive element is connected between the current monitor terminal and the second terminal.

7. The integrated circuit of claim 1, wherein the integrated circuit is configured to provide, at the temperature monitor terminal, a temperature monitor signal indicative of a temperature of the first resistive element.

8. The integrated circuit of claim 1, further comprising an amplifier circuit, wherein a first input of the amplifier circuit is coupled to the power transistor, wherein a second input of the amplifier circuit is coupled to the replica transistor, and wherein a first output of the amplifier circuit is coupled to the current monitor terminal.

9. The integrated circuit of claim 8, wherein the first input of the amplifier circuit is coupled to a source of the power transistor, wherein the second input of the amplifier circuit is coupled to a source of the replica transistor, and wherein a second output of the amplifier circuit is coupled to the source of the replica transistor.

10. The integrated circuit of claim 8, wherein the amplifier circuit is configured to regulate a voltage at a source of the replica transistor such that the voltage at the source of the replica transistor approaches a voltage at a source of the power transistor.

11. A method of operating an integrated circuit, the integrated circuit comprising a first terminal, a second terminal, a control terminal, a current monitor terminal, a power transistor coupled between the first terminal and the second terminal, and a replica transistor coupled between the first terminal and the current monitor terminal, the method comprising:

controlling a current between the first terminal and the second terminal based on a control signal applied to the control terminal;

providing, at the current monitor terminal, a current monitor signal indicative of a value of the current;

arranging a first resistive element in series with the replica transistor between the first terminal and the second terminal;

coupling a node connecting the first resistive element with the replica transistor to the current monitor terminal; and coupling a second resistive element between the second terminal and a temperature monitor terminal.

12. The method of claim 11, further comprising:

injecting a current into the temperature monitor terminal and, at the same time, measuring a voltage of the temperature monitor terminal; or connecting an external resistor between the temperature monitor terminal and the control terminal; or connecting an external resistor between the temperature monitor terminal and a supply voltage; or

forcing a voltage on the temperature monitor terminal and, at the same time, monitoring a current at the temperature monitor terminal.

13. An integrated circuit, comprising:
a first terminal;
a second terminal;
a control terminal;
a current monitor terminal;
a power transistor coupled between the first terminal and the second terminal; and
a replica transistor coupled between the first terminal and the current monitor terminal,
wherein the integrated circuit is configured to:

control a current between the first terminal and the second terminal based on a control signal applied to the control terminal;

provide, at the current monitor terminal, a current monitor signal indicative of a value of the current;

allow the current to flow in both directions, either from the first terminal to the second terminal or from the second terminal to the first terminal, by switching between an on-state and an off-state; and control the current in that both transistors are, depending on the control signal, either turned on or off.

14. The integrated circuit of claim 13, further comprising:
a first resistive element in series with the replica transistor between the first terminal and the second terminal, wherein a node connecting the first resistive element with the replica transistor is coupled to the current monitor terminal.

15. The integrated circuit of claim 14, further comprising:
a temperature monitor terminal; and
a second resistive element coupled between the second terminal and the temperature monitor terminal.

* * * * *